United States Patent
Bravo et al.

(10) Patent No.: US 8,941,977 B2
(45) Date of Patent: Jan. 27, 2015

(54) POWER SAFETY ASSEMBLY

(71) Applicant: Panduit Corp., Tinley Park, IL (US)

(72) Inventors: Rey Bravo, Manhattan, IL (US); John C. Senese, Naperville, IL (US)

(73) Assignee: Panduit Corp., Tinley Park, IL (US)

( * ) Notice: Subject to any disclaimer, the term of this patent is extended or adjusted under 35 U.S.C. 154(b) by 300 days.

(21) Appl. No.: 13/622,778

(22) Filed: Sep. 19, 2012

(65) Prior Publication Data

US 2013/0077258 A1    Mar. 28, 2013

Related U.S. Application Data

(60) Provisional application No. 61/539,211, filed on Sep. 26, 2011.

(51) Int. Cl.
*H05K 7/20* (2006.01)
*H02B 1/06* (2006.01)

(52) U.S. Cl.
CPC .............. *H02B 1/06* (2013.01); *H05K 7/20545* (2013.01); *H05K 7/20127* (2013.01)
USPC ............................ 361/641; 361/676; 361/690

(58) Field of Classification Search
CPC ............................. H05K 7/20521; H02B 1/06
USPC .................................................. 361/641, 676
See application file for complete search history.

(56) References Cited

U.S. PATENT DOCUMENTS

| | | | | |
|---|---|---|---|---|
| 3,354,435 A | * | 11/1967 | Picciano | 327/108 |
| 5,301,086 A | * | 4/1994 | Harris et al. | 361/641 |
| 6,373,688 B1 | | 4/2002 | Nagy et al. | |
| 6,375,561 B1 | | 4/2002 | Nicolai et al. | |
| 6,456,203 B1 | * | 9/2002 | Schomaker et al. | 340/638 |
| 6,668,565 B1 | * | 12/2003 | Johnson et al. | 62/89 |
| 6,731,507 B2 | * | 5/2004 | Varghese et al. | 361/725 |
| 6,772,246 B2 | | 8/2004 | Kim et al. | |
| 7,108,051 B2 | | 9/2006 | Hung | |
| 7,149,546 B1 | | 12/2006 | Hollen | |
| 7,209,360 B1 | | 4/2007 | Yarza | |
| 7,345,875 B2 | | 3/2008 | Elkins | |
| 7,432,441 B2 | | 10/2008 | Liang | |
| 7,794,312 B2 | | 9/2010 | Zimmer et al. | |
| 7,898,787 B2 | * | 3/2011 | Johnsen et al. | 361/119 |
| 8,003,899 B2 | | 8/2011 | WenLong et al. | |
| 8,173,898 B2 | * | 5/2012 | Rasmussen et al. | 174/50 |
| 2004/0201972 A1 | * | 10/2004 | Walesa | 361/788 |
| 2007/0072536 A1 | * | 3/2007 | Johnson et al. | 454/255 |
| 2010/0302727 A1 | | 12/2010 | Bellin et al. | |

FOREIGN PATENT DOCUMENTS

FR    2957198 A1    9/2011

OTHER PUBLICATIONS

Rittal cover plate FR7885.200, http://www.rittal.com/products/ArtikelDatenblatt.asp?ARTNR=7885200&lang=GB&Dom=com&usix=#, 2 webpages, printed Oct. 1, 2012.

* cited by examiner

*Primary Examiner* — Gregory Thompson

(74) *Attorney, Agent, or Firm* — Christopher S. Clancy; Aimee E. McVady

(57) ABSTRACT

The present invention is directed to an enclosure for electrical equipment. The enclosure includes a power plate assembly and a vented cover installed over the power plate assembly. Electrical components operating at 50 volts or more are mounted to a rail in the power plate assembly. The vented cover separates the electrical components mounted to the rail from the electrical components mounted in the enclosure.

11 Claims, 13 Drawing Sheets

POWER SAFETY ASSEMBLY

CROSS-REFERENCE TO RELATED APPLICATIONS

This application claims priority to U.S. Provisional Application No. 61/539,211, filed Sep. 26, 2011, the subject matter of which is hereby incorporated by reference in its entirety.

FIELD OF THE INVENTION

The present invention relates to enclosing power components in an enclosure for electrical equipment, and more particularly to a vented cover for enclosing power components in an enclosure for electrical equipment.

BACKGROUND OF THE INVENTION

Power terminals, contacts, conductors or other components operating at 50 volts or more in an enclosure need to be segregated and covered to ensure that personnel who are not trained do not have access to these terminals, contacts, conductors or other components. Generally, the power is turned off during maintenance of the components located in the enclosure. It would be desirable to eliminate the need to turn off the power to the enclosure by providing a method of segregating and covering the power terminals, contacts, conductors or other components operating at 50 volts or more in the enclosure. Therefore, allowing personnel who are trained to have access to the power terminals, contacts, conductors or other devices operating at less than 50 volts. It would also be desirable to maximize the amount of space available for mounting these power terminals, contacts, conductors or other components in the enclosure.

SUMMARY OF THE INVENTION

The present invention is directed to an enclosure for electrical equipment. The enclosure includes a power plate assembly and a vented cover installed over the power plate assembly. The power plate assembly includes a gland plate, gasket strips surrounding the gland plate for creating a moisture resistant connection with the enclosure and a standoff plate secured to the gland plate. Electrical components operating at 50 or more volts are secured to the power plate assembly. Since the vented cover is installed over the power plate assembly, the vented cover separates the electrical components in the enclosure that operate at 50 volts or more from electrical components installed in the enclosure that operate at less than 50 volts.

DETAILED DESCRIPTION

Figure 1:
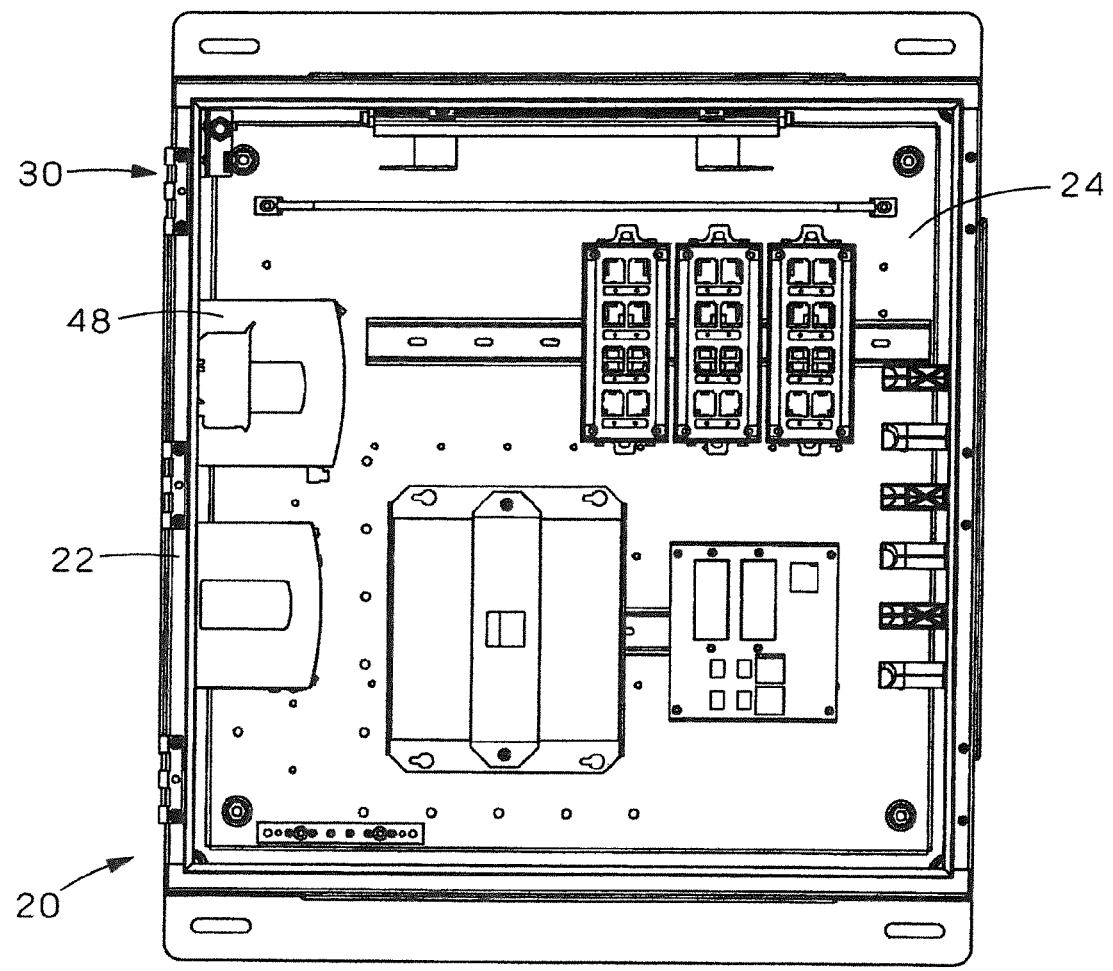
FIG. 1 is a front view of an enclosure for electrical equipment with a front cover removed.

FIG. 1 illustrates an enclosure for electrical equipment 20 with the front cover of the enclosure removed. The left side 22 of the enclosure 20 includes a gland plate 32 with a DIN rail 44 mounted to a DIN rail standoff plate 38 (see FIG. 3) which can be pre-wired as a sub-assembly prior to installation in the enclosure 20. The enclosure 20 also includes power terminals, contacts, conductors or other components operating at less than 50 volts mounted to a DIN rail on the enclosure back plate 24. Although a DIN rail is utilized in this enclosure, other industrial standard mounting techniques are acceptable. This enclosure illustrates the gland plate 32 located on the left side of the enclosure; however, the gland plate could be located on other walls of the enclosure.

Figure 2:
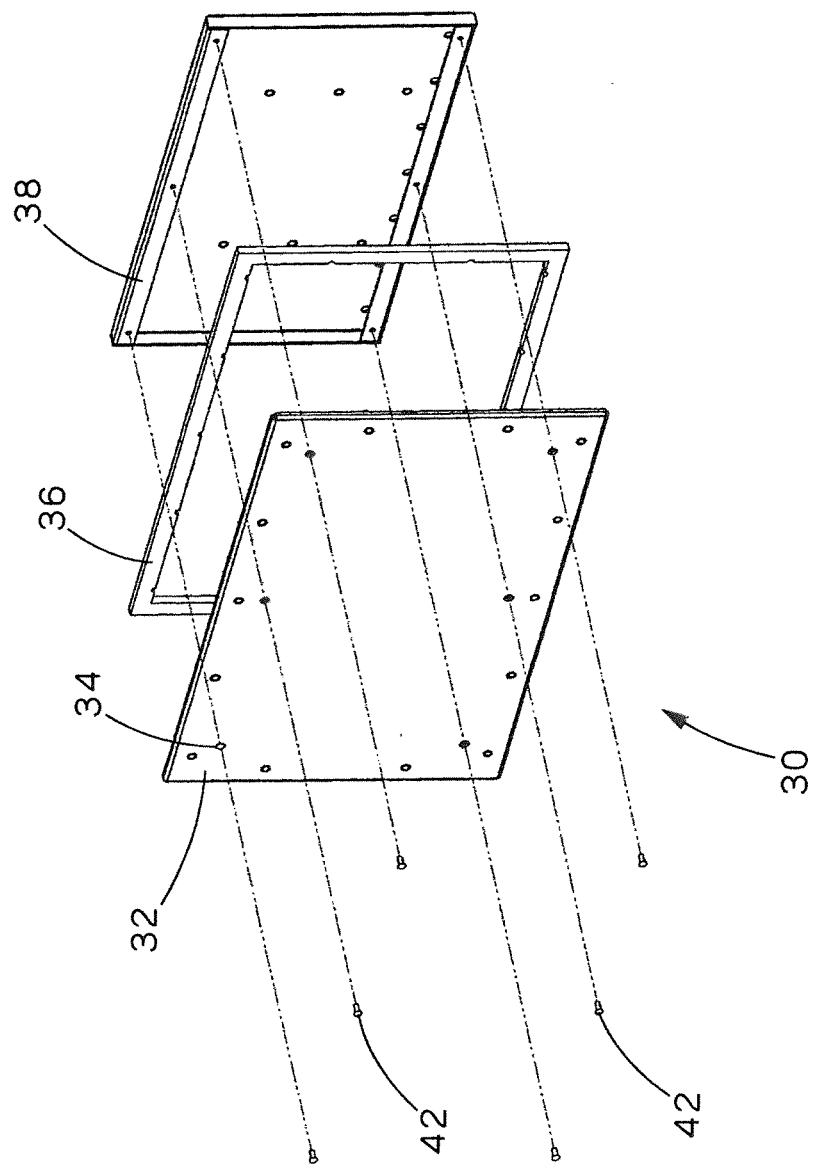
FIG. 2 is an exploded view of a power plate assembly to be installed in the enclosure of FIG. 1.

FIG. 2 illustrates elements of the power plate assembly 30 that is installed in the side 22 of the enclosure 20 of FIG. 1. The power plate assembly 30 includes a gland plate 32 with a plurality of countersunk rivet holes 34 positioned near the edges, gasket strips 36 and a DIN rail standoff plate 38. The gasket strips 36 are applied to the outside perimeter of the gland plate 32. The gasket strips are ¼ inch in height with the gland plate 32 having a flange with a height of ⅛ inch to limit the compression of the gasket to 50% when installed in the enclosure 20. The gasket strips 36 allow the power plate to create a dust and moisture resistant connection with the enclosure 20. The DIN rail standoff plate 38 is secured to the gland plate 32 via a plurality of flat head rivets 42 to form in the power plate assembly 30.

Figure 3:
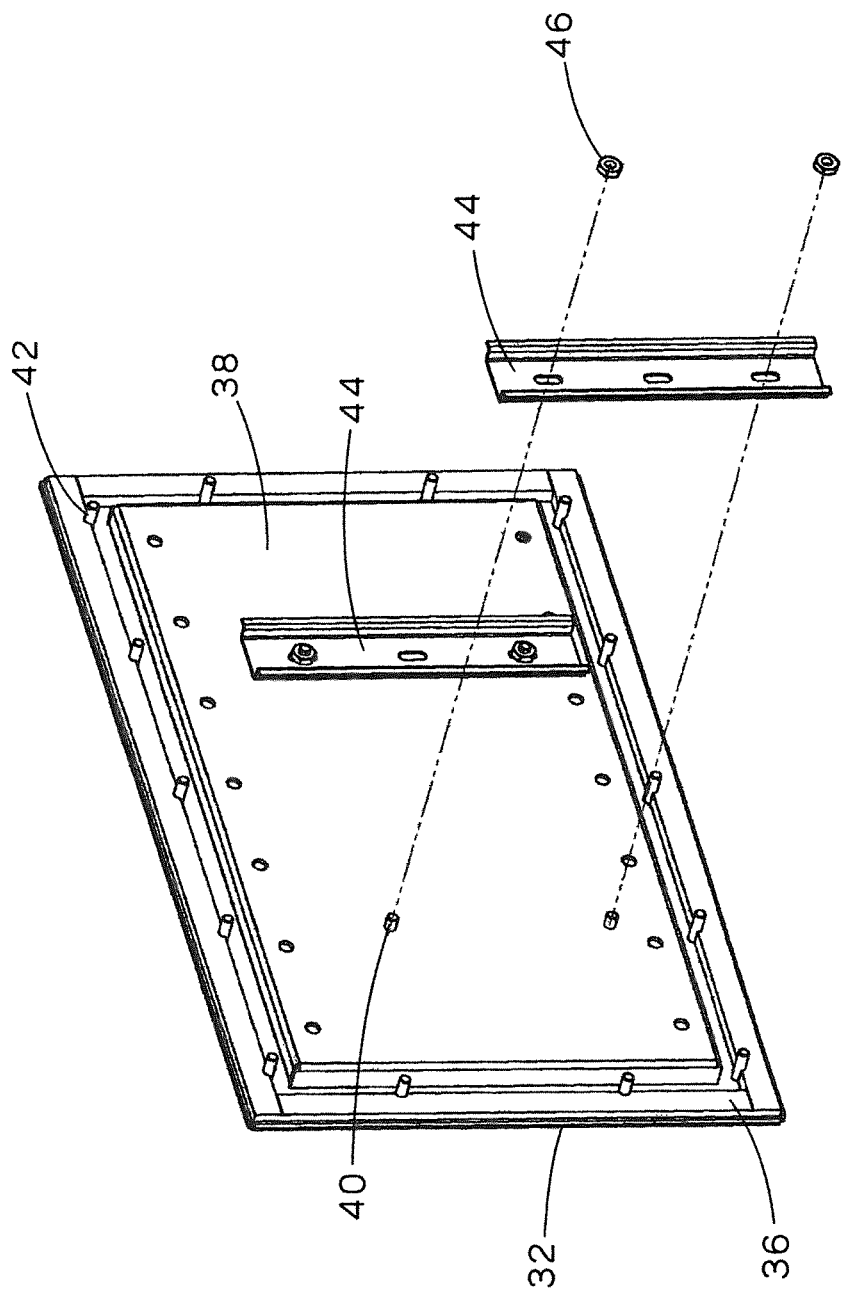
FIG. 3 is a front exploded view of the power plate assembly of FIG. 2 with a DIN rail positioned to be installed.

FIG. 3 illustrates the power plate assembly 30 with a DIN rail 44 cut to the desired length and positioned to be installed on the DIN rail standoff plate 38. The DIN rail standoff plate 38 has threaded studs 40 pressed in place to mount the DIN rail 44 with hex nuts 46 or other industry standard fasteners. Once the DIN rails 44 are secured to the DIN rail standoff plate 38, the components 48 may be installed.

Figure 4:
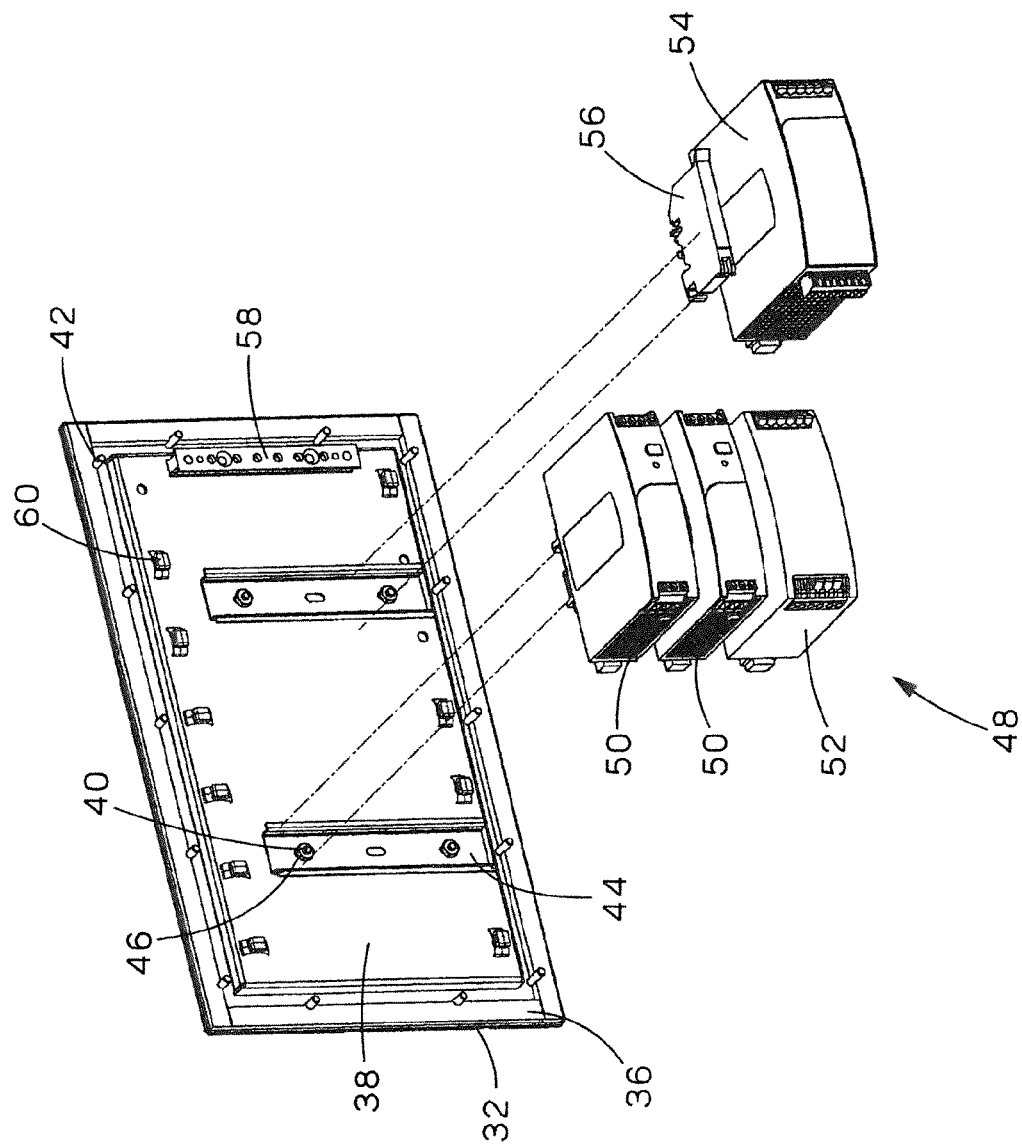
FIG. 4 is front exploded view of the power plate assembly of FIG. 3 with electrical components positioned to be installed.

FIG. 4 illustrates typical components 48 being installed on the DIN rail. For example, a power supply 50, a surge or filter 52, a DC UPS 54 and a fuse 56 may be installed on the power plate assembly 30. The power plate assembly 30 utilized in this enclosure also includes an optional ground bar 58 for easier termination. The power plate assembly 30 may also include optional push-in place cable retaining clips 60 to route and protect wiring routing thereon. The power plate assembly 30 can be pre-wired before it is installed in the side 22 of the enclosure 20.

Figure 5:
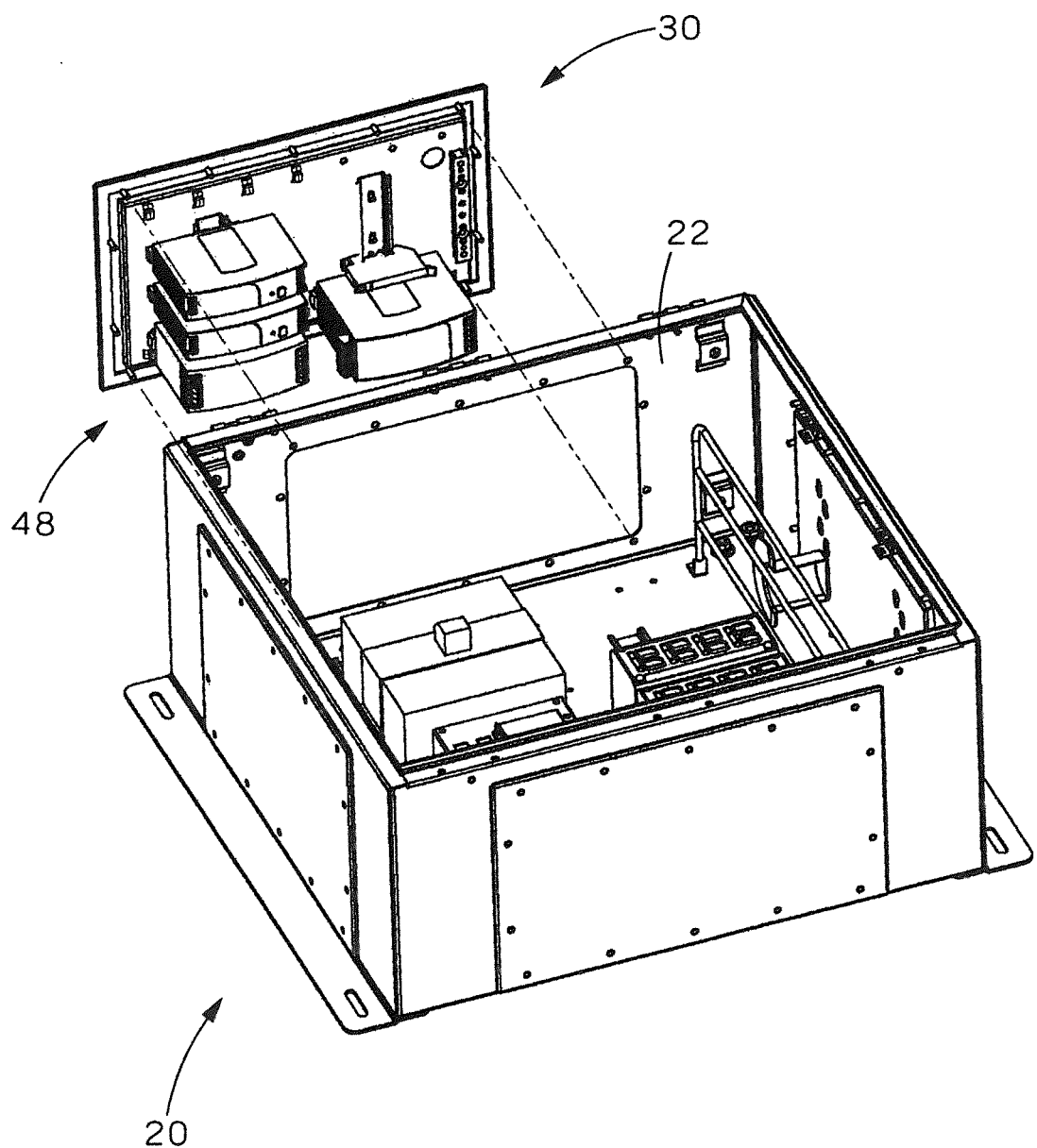
FIG. 5 is an exploded view of the power plate assembly of FIG. 4 positioned to be installed in the enclosure.
Figure 6:
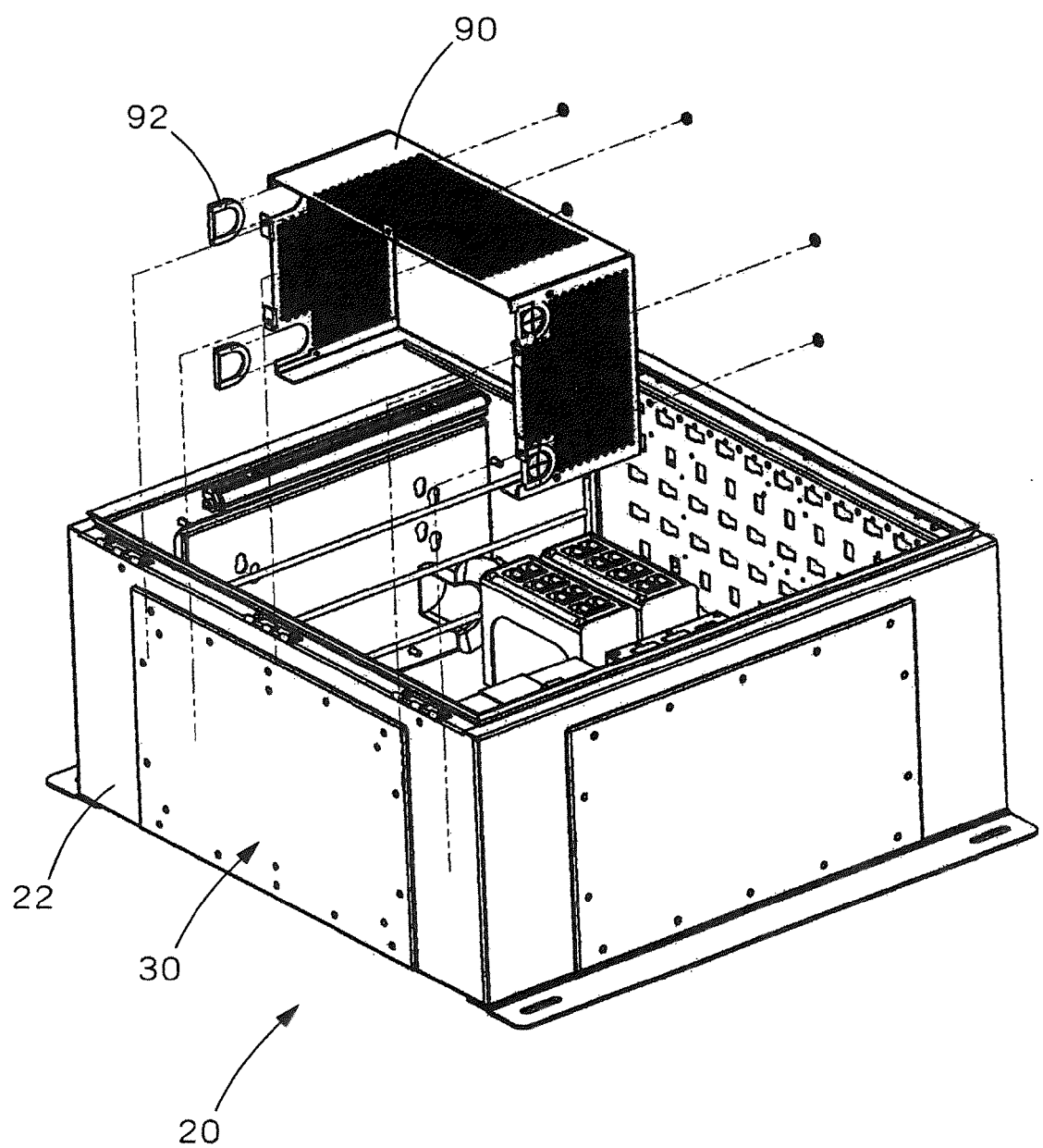
FIG. 6 is an exploded view of the power plate assembly installed in the enclosure of FIG. 5 with a vented cover positioned to be installed over the power plate assembly.

FIG. 5 illustrates the power plate assembly 30 with the installed electrical components 48 positioned to be installed in the enclosure 20. The power plate assembly 30 is installed in the side 22 of the enclosure 20 with hex nuts or other industry standard fasteners. Once installed, the final wiring is completed within the enclosure. Next, as illustrated in FIG. 6, a vented or perforated cover 90 is installed over the power plate assembly 30 inside the enclosure 20. The vented cover includes openings or holes in at least one of the top and sides of the cover, as desired. The power wiring enters and exits the vented cover 90 through removable rubber grommets 92 positioned around the cover 90. The vented cover 90 is secured in place with tamper resistant fasteners to prevent removal by personnel who are not trained to access or maintain the power terminals, contacts, conductors or other components located within the power plate assembly. The vented cover 90 allows heat to dissipate from the components. Furthermore, the conductors operating at 50 volts or more within the enclosure and outside the vented cover are enclosed in a protective sheath to maintain the separation of these conductors from the area operating at less than 50 volts.

Figure 7:
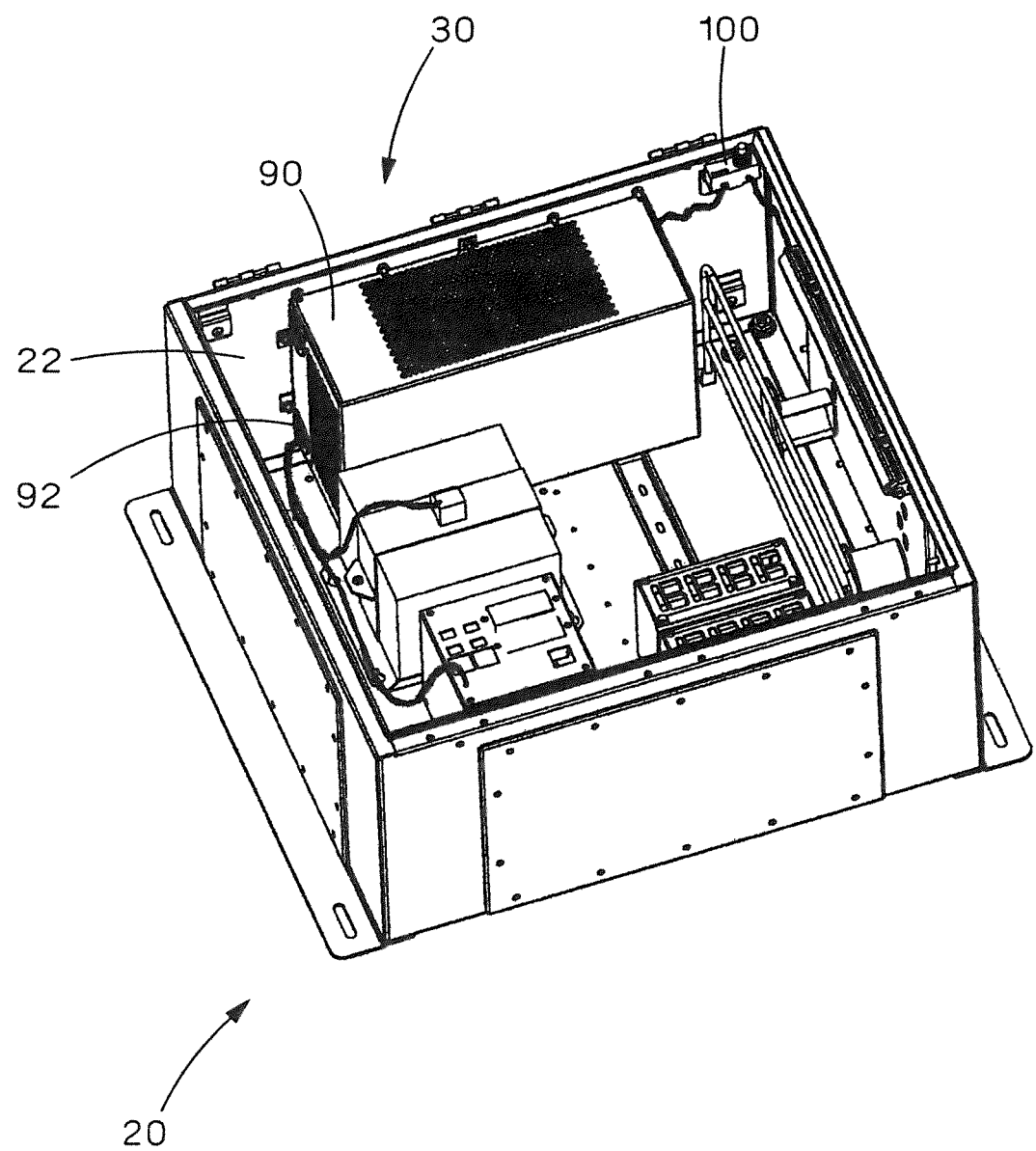
FIG. 7 is a top perspective view of the power plate assembly and vented cover of FIG. 6 installed in the enclosure.

FIG. 7 illustrates the power plate assembly 30 and vented cover 90 fully installed in the enclosure 20. As a result, the power terminals, contacts, conductors or other components operating at 50 volts or more are separated from power terminals, contacts, conductors, or other components operating at less than 50 volts. Therefore per industry standards, the shock hazard of the power terminals, contacts, conductors or other components operating at less than 50 volts is mitigated. Furthermore, FIG. 7 also illustrates an optional LED door switch 100 that will be wired to the covered power supplies through the grommets in the vented cover. This optional LED door switch operates at less than 50 volts.

Figure 8:
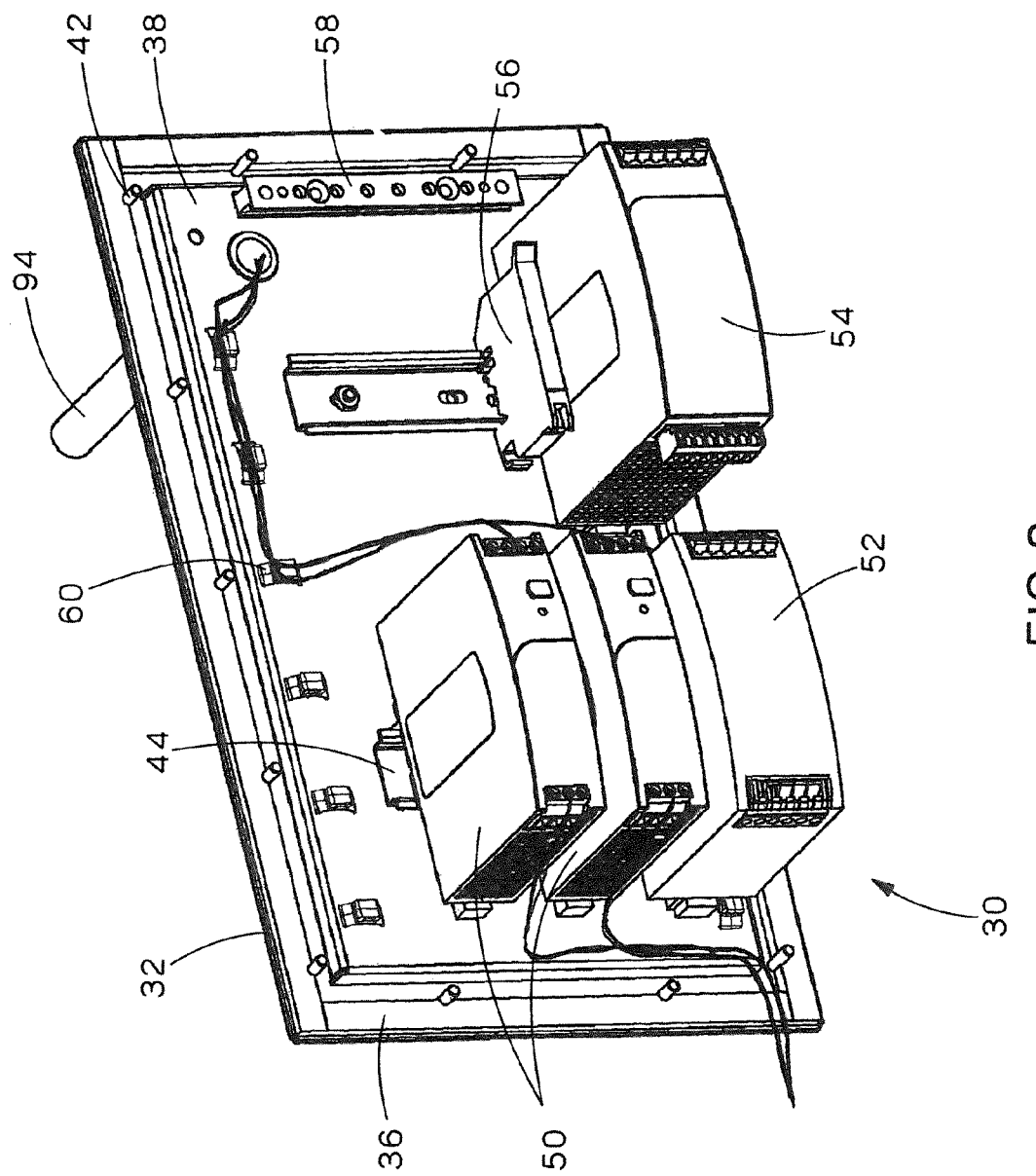
FIG. 8 is a front perspective view of the power plate assembly of FIG. 5 with power entry through the gland plate.
Figure 9:
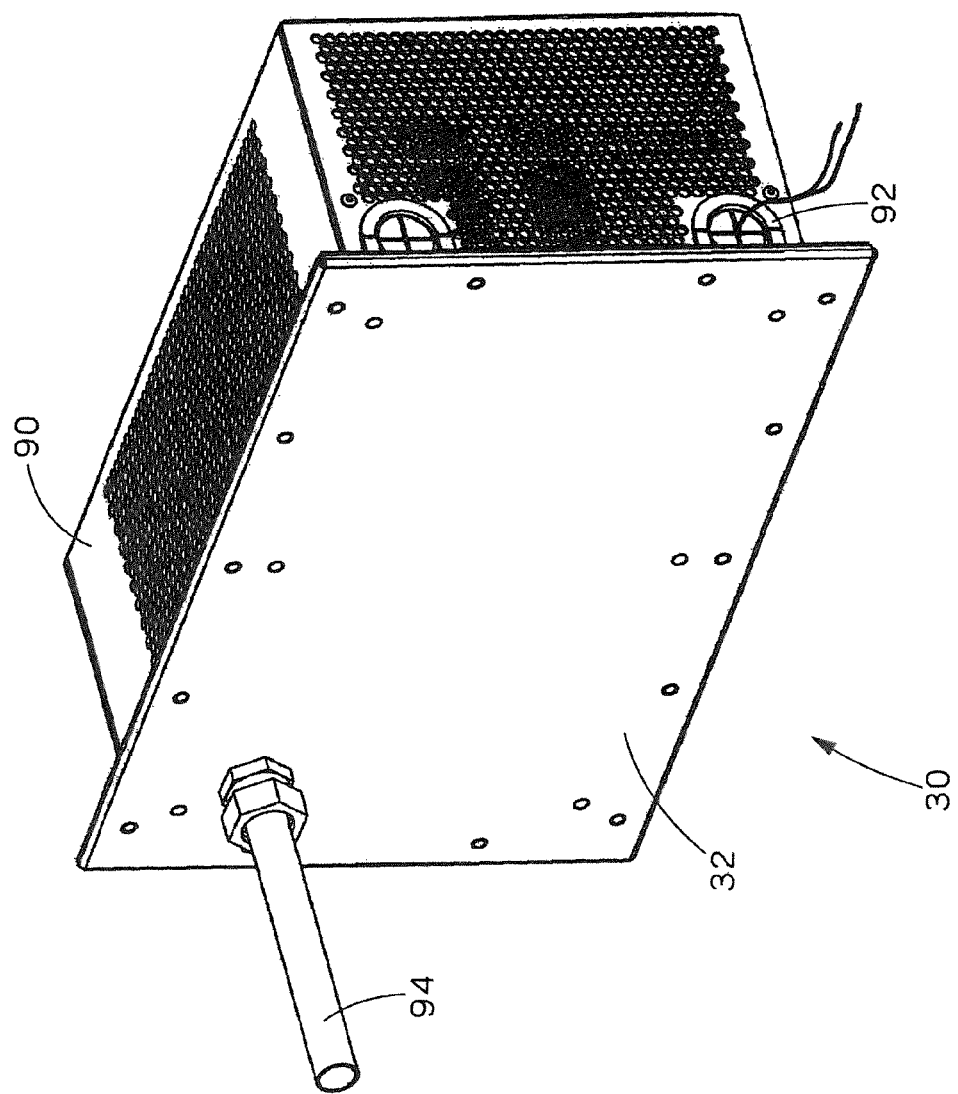
FIG. 9 is a back perspective view of the power plate assembly of FIG. 8 with the vented cover installed on the power plate assembly.

FIGS. 8 and 9 illustrate the power plate assembly 30 and the vented cover 90 of the present invention. Conductors operating at 50 volts or more can be connected to the outside of the power plate assembly to allow the power entry 94 through the gland plate 32 and under the vented cover plate 90. Thus, the vented cover plate 90 completely covers the incoming conductors operating at 50 volts or more.

Figure 10:
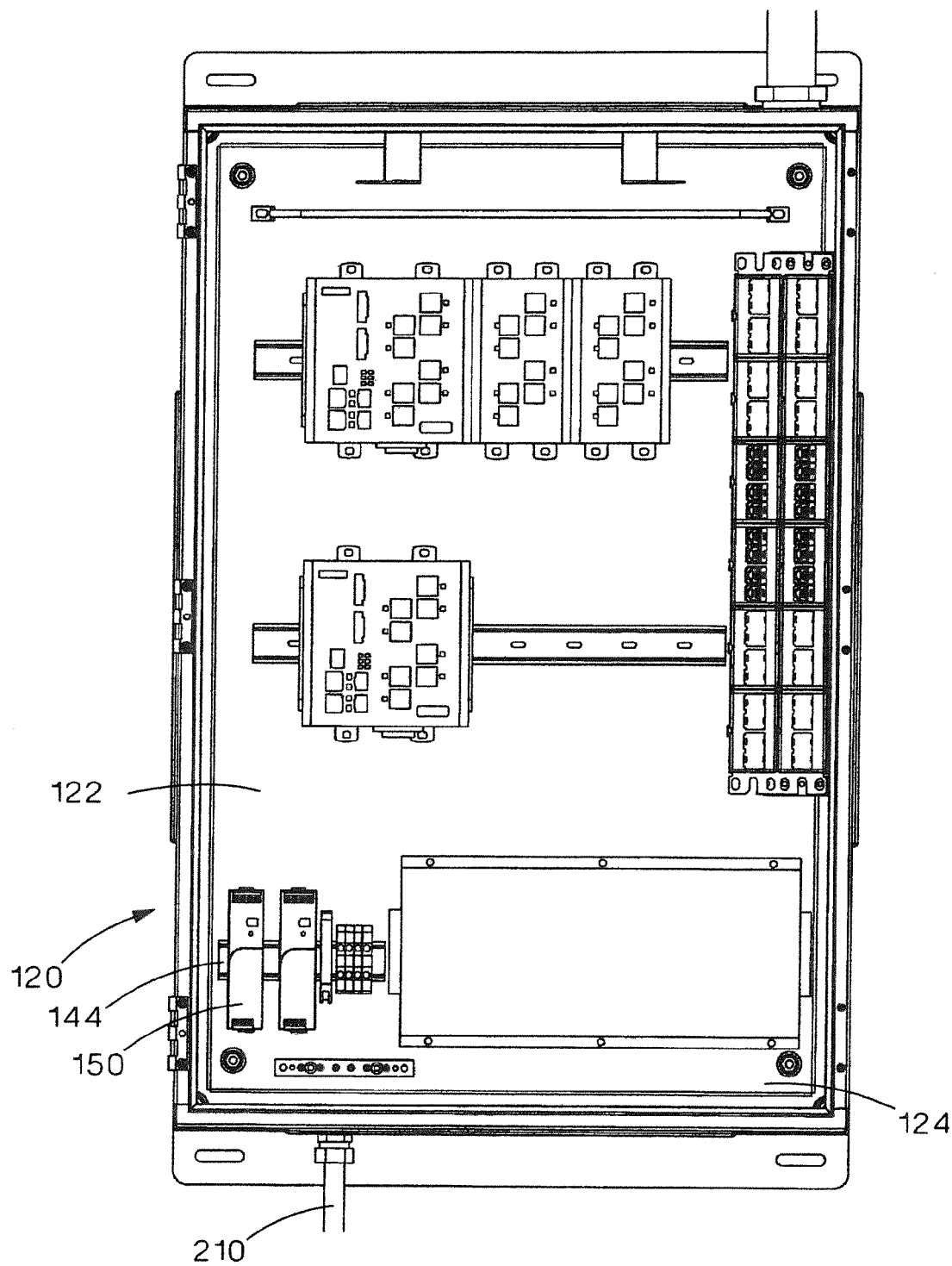
FIG. 10 is a front view of an alternative enclosure for electrical equipment with a front cover removed.

FIGS. 10-13 illustrate an alternative enclosure 120 with a power plate assembly 30 and vented or perforated cover 190. FIG. 10 illustrates a pre-configured enclosure. All of the power terminals 150, contacts, conductors or other components operating at 50 volts or more are mounted on the enclosure back plate 122 at the bottom 124 of the enclosure 120 to allow a single vented cover 190 to be installed over the components. The components outside of the covered area operate at less than 50 volts.

Figure 11:
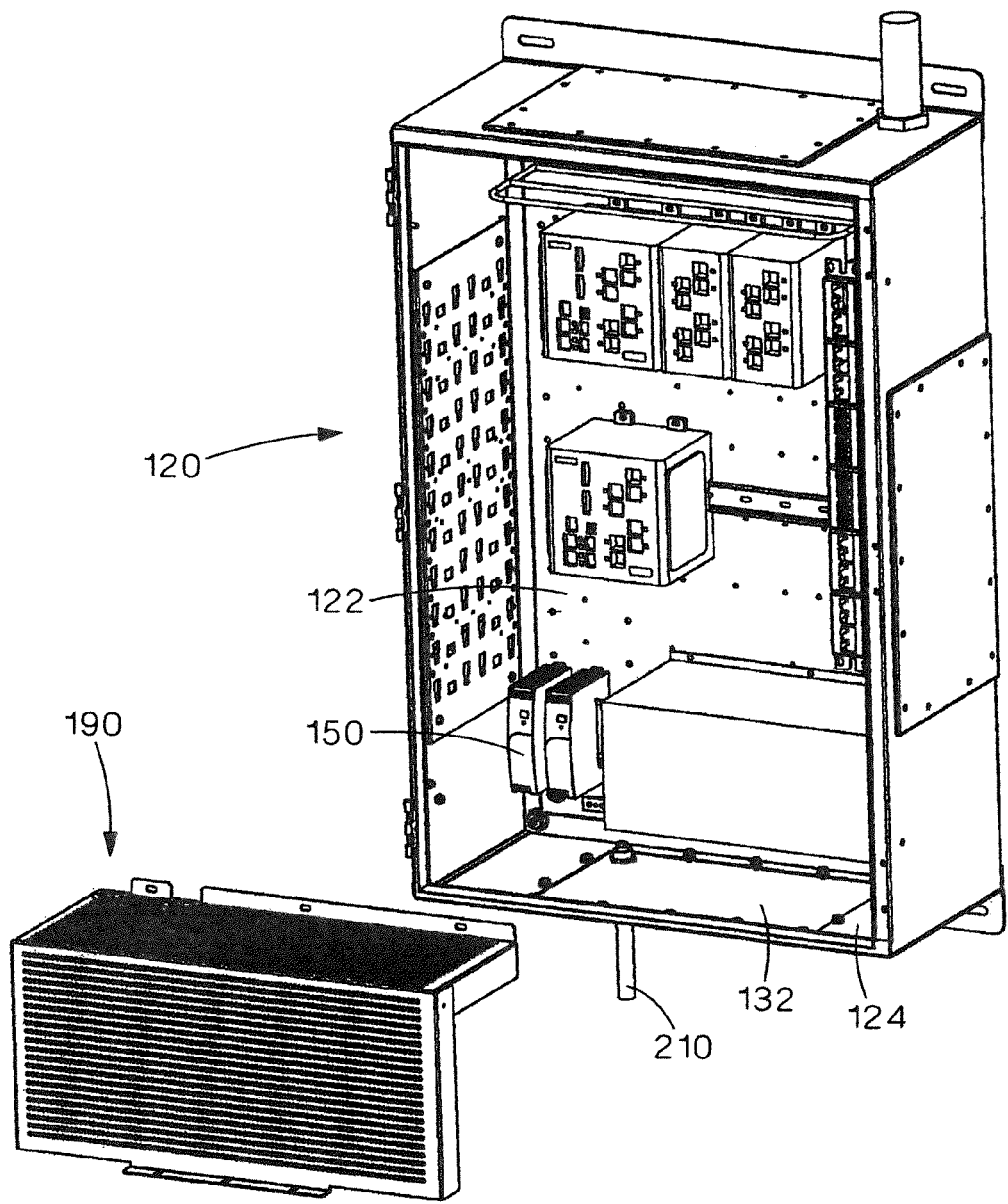
FIG. 11 is a front exploded perspective view of the enclosure of FIG. 10 with an alternative vented cover positioned to be installed in the enclosure.

FIG. 11 illustrates the enclosure 120 with a vented cover 190 positioned to be installed over the removable gland plate 132 and the power terminals 150, contacts, conductors or other components operating at 50 volts or more that are mounted to the DIN rail 144 (see FIG. 10) on the enclosure mounted to back plate 122. The vented cover 190 will be fastened in place with tamper resistance fasteners. As illustrated, incoming conductors operating at 50 volts or more 210 are brought into the zone enclosure 120 through a fitting installed on the gland plate 132. As a result, the power terminals, contacts, conductors or other components operating at 50 volts or more are separated from power terminals, contacts, conductors, or other components operating at less than 50 volts. Therefore per industry standards, the shock hazard of the power terminals, contacts, conductors or other components operating at less than 50 volts is mitigated.

Figure 12:
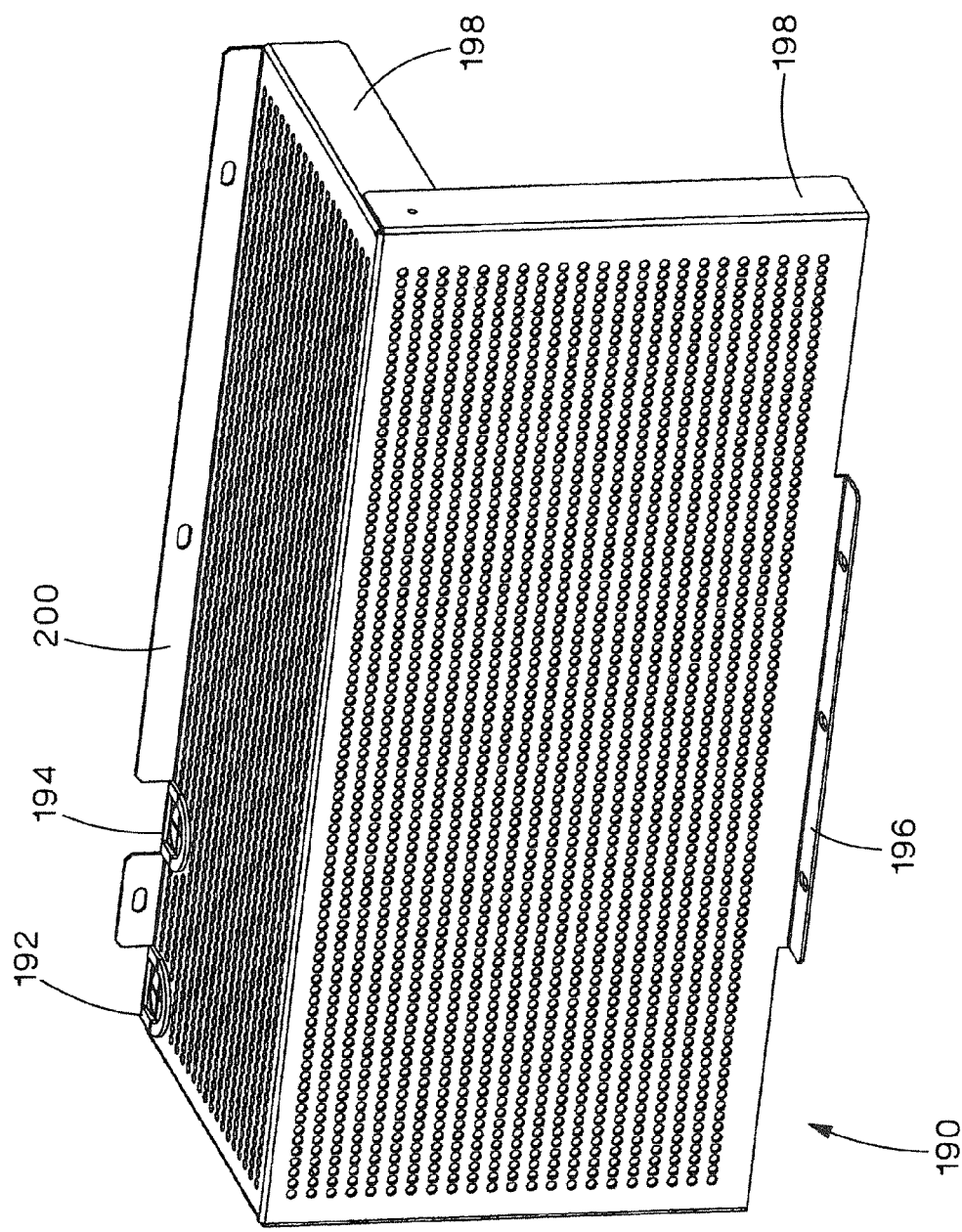
FIG. 12 is a perspective view of the alternative vented cover of FIG. 11.

FIG. 12 illustrates the vented cover 190. The vented cover 190 allows heat generated from the power terminals 150, contacts, conductors or other components operating at 50 volts or more to dissipate. As discussed above, the vented cover 190 also separates the power terminals, contacts, conductors or other components operating at 50 volts or more from power terminals, contacts, conductors, or other components operating at less than 50 volts. The vented cover 190 can include grommets. Grommet 192 for entry of power for terminals, contacts, conductors or other components operating at 50 volts or more (if the power entry is not through the gland plate 132) and a grommet 194 for an exit of power terminals, contacts, conductors, or other components operating at less than 50 volts can be located at various places on the cover. The vented cover 190 also includes a back flange 196 to attach to the enclosure bottom gland plate threaded studs, flanged edges 198 for rigidity, and a bottom flange 200 to attach to the enclosure back plate 122. Furthermore, the conductors operating at 50 volts or more within the enclosure and outside the vented cover are enclosed in a protective sheath to maintain the separation of these conductors from the area operating at less than 50 volts.

Figure 13:
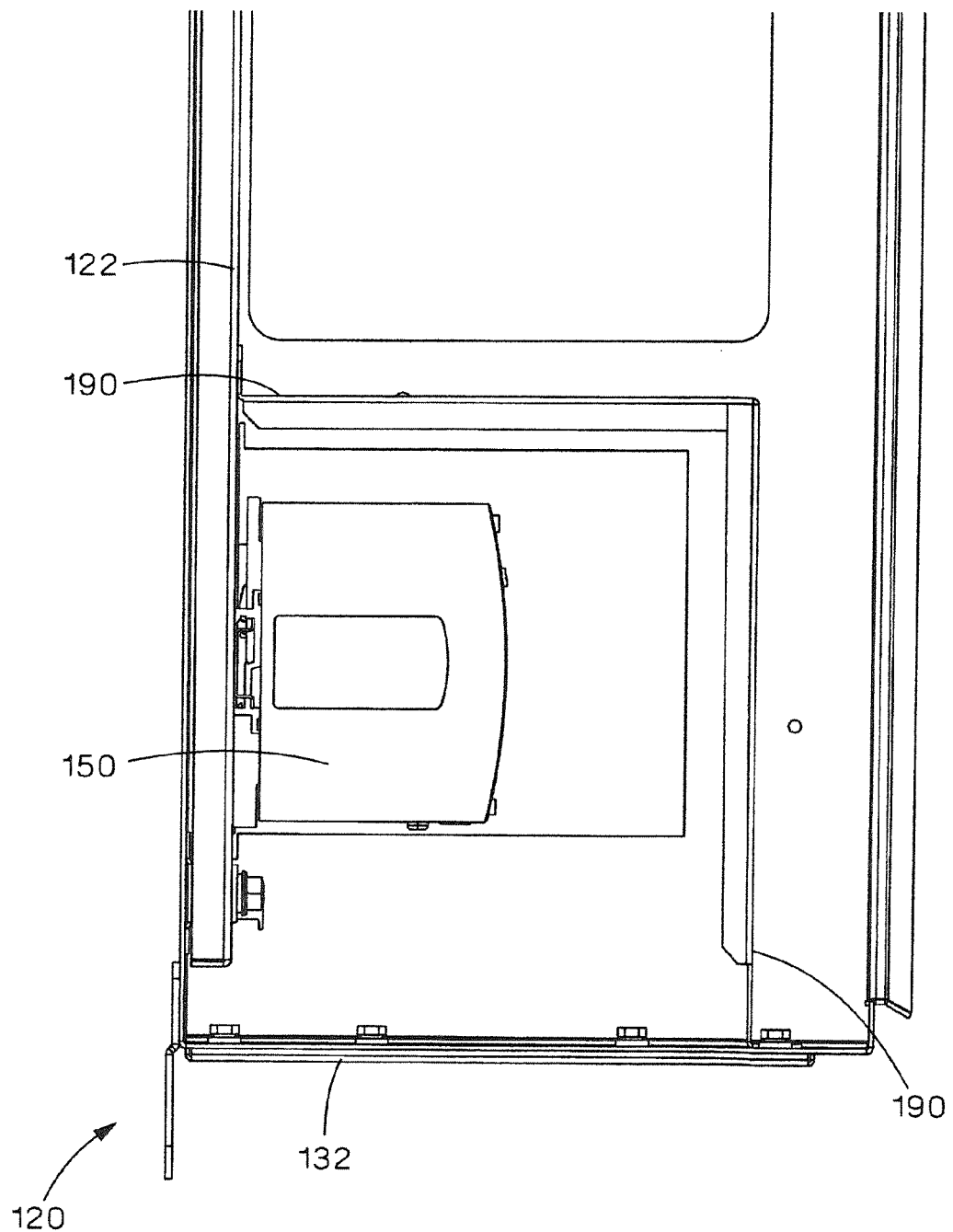
FIG. 13 is a side view of the enclosure with the alternative vented cover of FIG. 11 installed over the power plate assembly.

FIG. 13 illustrates a cross section of the enclosure 120 with the vented cover 190 positioned over the power terminals 150, contacts, conductors or other components operating at 50 volts or more. The vented cover is mounted on the back plate 122 and secured to the gland plate 132 via a threaded stud. Although this enclosure illustrates the vented cover, gland plate and the power terminals, contacts, conductors or other components operating at 50 volts or more located at the bottom of the enclosure, these components could be located on different faces of the enclosure.

The enclosure for electrical equipment power plate assembly of the present invention provides protection against accidental contact with power terminals, contacts or conductors operating at 50 volts or more by personnel who are not trained to access or maintain these terminals, contacts or conductors by totally enclosing these components under a tamper resistant cover. The power plate assembly completely encloses incoming wiring operating at 50 volts or more by providing a location for the incoming conductor entry into the gland plate of the power plate assembly. The power plate assembly provides the ability to access the enclosure without removing power to the terminals, contacts or conductors operating at less than 50 volts and maximizes the available space on the enclosure back plate for equipment by moving the components operating at 50 volts or more to the side or bottom of the enclosure. Thus, the power plate assembly and the vented cover of the present invention segregate and cover power terminals, contacts or conductors operating at 50 volts or more form personnel who are not trained to access or maintain these terminals, contacts or conductors while maximizing the available space on the enclosure back plate.

Furthermore, while the particular preferred embodiments of the present invention have been shown and described, it will be obvious to those skilled in the art that changes and modifications may be made without departing from the teaching of the invention. The matter set forth in the foregoing description and accompanying drawings is offered by way of illustration only and not as limitation.

The invention claimed is:

1. An enclosure for electrical equipment, the enclosure comprising:
    a power plate assembly including a gland plate, gasket strips surrounding the gland plate for creating a moisture resistant connection with the enclosure, and a standoff plate secured to the gland plate; and
    a vented cover installed over the power plate assembly inside the enclosure.

2. The enclosure of claim 1, wherein the power plate assembly is installed in a side of the enclosure.

3. The enclosure of claim 1, wherein the standoff plate further comprising a rail and electrical components mounted to the rail.

4. The enclosure of claim 3, wherein the electrical components mounted to the rail operate at 50 volts or more; and wherein the vented cover separates the electrical components mounted to the rail from electrical components mounted in the enclosure that operate at less than 50 volts.

5. The enclosure of claim 1, wherein the vented cover comprising rubber grommets for enabling power wiring to be routed therein.

6. The enclosure of claim 1, wherein the vented cover is secured via tamper resistant fasteners to prevent removal of the vented cover and electrical components installed on the power plate assembly.

7. The enclosure of claim 1, wherein the vented cover enables heat to dissipate from electrical components installed on the power plate assembly.

8. An enclosure for electrical equipment, the enclosure comprising:

a back plate,
   a plurality of electrical components operating at 50 volts or more mounted on the back plate;
   a gland plate installed in a bottom of the enclosure;
   a vented cover installed over the gland plate and the plurality of components operating at 50 volts or more; and
   a plurality of electrical components operating at less than 50 volts installed in the enclosure;
   whereby the vented cover maintains the separation of the electrical components operating at 50 volts or more and the electrical components operating at less than 50 volts.

9. The enclosure of claim 8, wherein the vented cover includes a grommet for enabling power wiring to be routed therein.

10. The enclosure of claim 8, wherein the vented cover having a back flange to attach the vented cover to the gland plate and a bottom flange to attach the vented cover to the back plate of the enclosure.

11. The enclosure of claim 8, wherein the vented cover having flanged edges along at least one side of the vented cover for providing rigidity to the vented cover.

\* \* \* \* \*